(12) United States Patent
Ito

(10) Patent No.: US 6,481,119 B1
(45) Date of Patent: Nov. 19, 2002

(54) APPARATUS FOR REMOVING ORGANIC ANTIREFLECTION COATING

(75) Inventor: Jiro Ito, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/631,624

(22) Filed: Aug. 4, 2000

(30) Foreign Application Priority Data

Feb. 15, 2000 (JP) ........................................ 2000-036408

(51) Int. Cl.⁷ ................................................ F26B 9/00
(52) U.S. Cl. ................................ 34/629; 34/60; 34/218; 34/220; 34/224; 34/232; 34/221; 428/403; 428/426; 428/620; 428/627
(58) Field of Search ............................ 34/60, 629, 218, 34/220, 221, 224, 232; 428/403, 426, 620, 627; 204/192.1, 192.15, 192.27; 427/248.1, 578, 583; 438/485, 717, 719, 761; 156/345, 357, 379.6; 118/721, 723 MP, 724, 56

(56) References Cited

U.S. PATENT DOCUMENTS 6,209,484 B1 * 4/2001 Huang et al. ............ 118/723 E

FOREIGN PATENT DOCUMENTS

| JP | 10-242127 | 9/1998 |
| KR | 10-0209698 | 4/1999 |
| KR | 10-0239719 | 10/1999 |

* cited by examiner

*Primary Examiner*—William C. Doerrler
*Assistant Examiner*—Mark Shulman
(74) *Attorney, Agent, or Firm*—McDermott, Will & Emery

(57) ABSTRACT

An organic antireflection coating is formed on a semiconductor substrate. A resist film is formed on the semiconductor substrate through the organic antireflection coating. The resist film is patterned for forming a resist pattern having an opening. A part of the organic antireflection coating exposed on the bottom of the opening of the resist pattern is removed with atomic oxygen. Thus provided is a method of forming a resist pattern so improved as to increase the dimensional accuracy of the resist pattern.

3 Claims, 8 Drawing Sheets

FIG. 15    PRIOAR ART
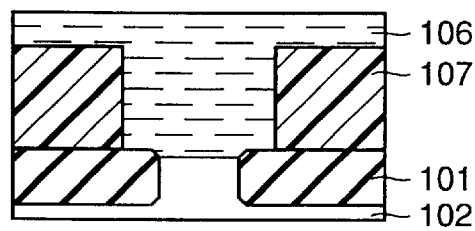
FIG. 16    PRIOAR ART
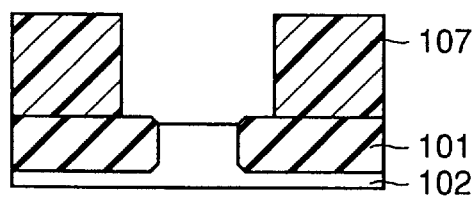
FIG. 17A
PRIOAR ART
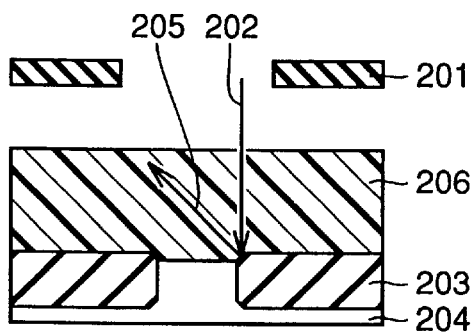
FIG. 17B
PRIOAR ART
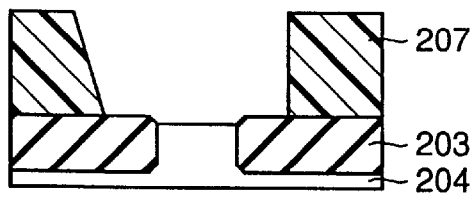

PRIOAR ART

PRIOAR ART

PRIOAR ART

PRIOAR ART

APPARATUS FOR REMOVING ORGANIC ANTIREFLECTION COATING

BACKGROUND OF THE INVENTION

1. Field of the Invention

The present invention generally relates to a method of forming a resist pattern, and more specifically, it relates to a method of forming a resist pattern employed for ion implantation. The present invention also relates to a method of manufacturing a semiconductor device including such a method of forming a resist pattern. The present invention further relates to an apparatus for removing an organic antireflection coating.

2. Description of the Prior Art

FIGS. 12 to 16 are sectional views of a semiconductor device showing parts of steps of a conventional method of manufacturing a semiconductor integrated circuit for illustrating a method of forming a resist pattern employed for ion implantation.

Referring to FIG. 12, a silicon substrate 102 formed with an isolation oxide film 101 is prepared.

Referring to FIG. 13, a photosensitive resist film 103 is formed on the silicon substrate 102.

Referring to FIG. 14, the photosensitive resist film 103 is first exposed to exposure light 105 such as X-rays or ultraviolet rays through a mask pattern 104.

Referring to FIG. 15, the exposed photosensitive resist film 103 is brought into contact with a developer 106 mainly composed of aqueous trimethylammonium hydride (TMAH) for removing the exposed part thereof, thereby obtaining a resist pattern 107.

Referring to FIG. 16, ions are implanted into the silicon substrate 102 through the resist pattern 107 serving as a mask.

Conventional ion implantation is performed in the aforementioned manner. However, the shape or size of the formed resist pattern 107 is disadvantageously rendered abnormal depending on the shape of the underlayer or the relative positional relation between the underlayer and the mask.

Referring to FIGS. 17A and 17B, for example, part of exposure light 202 passing through a mask 201 strikes a tapered portion on the upper end of an isolation oxide film 203 to form reflected light 205. The reflected light 205 disadvantageously exposes a part of a photosensitive resist film 206 located on an essentially unexposed region. As shown in FIG. 17B, therefore, a resist pattern 207 is formed in a shape different from a desired one. In other words, the size of the resist pattern 207 disadvantageously varies with the shape of the isolation oxide film 203.

Referring to FIGS. 18A and 18B, the isolation oxide film 203 has high transmittance for the exposure light 202. On the other hand, a silicon substrate 204 has high reflectivity with substantially no transmittance. Therefore, the exposure light 202 passing through the mask 201 is reflected by the uppermost surface and the bottom surface of the isolation oxide film 203, to form reflected light components 211 and 212. Combined light of the two reflected light components 211 and 212 sensitizes the photosensitive resist film 206. The intensity of the combined light remarkably depends on the phase shift between the two reflected light components 211 and 212. When the thickness of the isolation oxide film 203 fluctuates, therefore, the optical path length of the reflected light component 211 as well as the phase shift between the reflected light components 211 and 212 also change. Therefore, the intensity of the light exposing the photosensitive resist film 206 changes. Thus, the size of the formed resist pattern 207 also changes. In other words, the size of the resist pattern 207 disadvantageously varies with the thickness of the isolation oxide film 203.

Referring to FIGS. 19A and 19B, reflected light 221 is generated due to multiple reflection in the isolation oxide film 203 when the bottom end portion of the isolation oxide film 203 is differentially tapered. The reflected light 221 disadvantageously sensitizes a part of the photosensitive resist 206 located on the essentially unexposed region. Therefore, the resist pattern 207 is finished in a shape different from the desired one. In other words, the resist pattern 207 disadvantageously varies with the shape of the isolation oxide film 203.

In a step of forming such a resist pattern readily influenced by the underlayer, a photosensitive resist film containing a dye or an organic antireflection coating is generally employed.

The present invention is directed to a method of forming a resist pattern in an ion implantation step. A resist pattern formed according to the present invention is generally employed as a mask for implanted species, and hence the thickness of a photosensitive resist film is 2 to 6 $\mu$m, which is largest among those of resist films employed in general steps of forming a semiconductor integrated circuit.

FIG. 20 shows a sectional shape of a resist pattern 303 formed from a photosensitive resist film containing a dye.

The amount of energy of light received by the photosensitive resist film from exposure light is reduced in descending order from the uppermost layer to the lowermost layer of the resist film, and hence an end of the resist pattern 303 tends to be blind over edging as shown in FIG. 20, disadvantageously leading to reduction of dimensional accuracy.

FIG. 21 shows a sectional shape of a resist pattern 404 formed through an organic antireflection coating 403. When employing the organic antireflection coating 403, influence by an underlayer can be suppressed and hence the shape of the formed resist pattern 404 is stabilized. After formation of the resist pattern 404, however, the organic antireflection coating 403 remains on the bottom of an opening 405, which must essentially be subjected to ion implantation. The organic antireflection coating 403 remaining on the bottom of the opening 405 disadvantageously serves as a mask for ion implantation.

When performing ion implantation through the organic antireflection coating 403, substances contained in the organic antireflection coating 403 are secondarily injected into a silicon substrate 401, to disadvantageously contaminate the silicon substrate 401.

In the ion implantation step for manufacturing a semiconductor integrated circuit, as hereinabove described, the quality of the underlayer for forming the resist pattern is generally optically heterogeneous as shown in each of FIGS. 12 to 21. Particularly in the device isolation step, the silicon substrate having high reflectance and the transparent isolation oxide film readily causing interference of light due to the thickness are alternately arranged while the resist pattern is formed with following the boundary between the silicon substrate region and the isolation oxide film region. Therefore, the aforementioned problems extremely readily arise. Under such circumstances, the antireflection coating is indispensable for suppressing influence by the underlayer, and a technique is required for exerting no bad influence on the silicon substrate.

SUMMARY OF THE INVENTION

The present invention has been proposed in order to solve the aforementioned problems, and an object thereof is to provide a method of forming a resist pattern, which is so improved as to exert no bad influence on a silicon substrate in ion implantation.

Another object of the present invention is to provide a method of manufacturing a semiconductor device including such a method of forming a resist pattern.

Still another object of the present invention is to provide an apparatus for removing an organic antireflection coating without exerting bad influence on a silicon substrate in ion implantation.

According to a first aspect of the present invention, a method of forming a resist pattern employed for ion implantation is provided. First, an organic antireflection coating is formed on a semiconductor substrate. A resist film is formed on the semiconductor substrate through the aforementioned organic antireflection coating. The aforementioned resist film is patterned for forming a resist pattern having an opening. A part of the aforementioned organic antireflection coating exposed on the bottom of the opening of the aforementioned resist pattern is removed.

Preferably, the part of the aforementioned organic antireflection coating is removed with ozone.

Preferably, the part of the aforementioned organic antireflection coating is removed with atomic oxygen.

Preferably, the aforementioned atomic oxygen is formed from air.

Preferably, the aforementioned atomic oxygen is formed from $O_2$ plasma.

Preferably, the step of removing the part of the aforementioned organic antireflection coating with ozone includes steps of bringing the aforementioned semiconductor substrate into contact with ozone and heating the aforementioned semiconductor substrate thereby thermally decomposing the aforementioned ozone.

Preferably, the step of forming the aforementioned atomic oxygen from air includes steps of bringing the aforementioned semiconductor substrate into contact with air and irradiating the aforementioned semiconductor substrate with excimer light.

Preferably, the step of forming the aforementioned atomic oxygen from $O_2$ plasma includes a step of removing charged species carrying positive charges and charged species carrying negative charges from the aforementioned $O_2$ plasma.

In a method of manufacturing a semiconductor device according to another aspect of the present invention, an organic antireflection coating is first formed on a semiconductor substrate. A resist film is formed on the aforementioned semiconductor substrate through the aforementioned organic antireflection coating. The aforementioned resist film is patterned for forming a resist pattern having an opening. A part of the aforementioned organic antireflection coating exposed on the bottom of the opening of the aforementioned resist pattern is removed. Ions are implanted into the surface of the aforementioned semiconductor substrate through the aforementioned resist pattern.

Preferably, the part of the aforementioned organic antireflection coating is removed with ozone.

Preferably, the part of the aforementioned organic antireflection coating is removed with atomic oxygen.

Preferably, the aforementioned atomic oxygen is formed from air.

Preferably, the aforementioned atomic oxygen is formed from $O_2$ plasma.

Preferably, the step of removing the part of the aforementioned organic antireflection coating with ozone includes steps of bringing the aforementioned semiconductor substrate into contact with ozone and heating the aforementioned semiconductor substrate thereby thermally decomposing the aforementioned ozone.

Preferably, the step of forming the aforementioned atomic oxygen from air includes steps of bringing the aforementioned semiconductor substrate into contact with air and irradiating the aforementioned semiconductor substrate with excimer light.

Preferably, the step of forming the aforementioned atomic oxygen from $O_2$ plasma includes a step of removing charged species carrying positive charges and charged species carrying negative charges from the aforementioned $O_2$ plasma.

According to still another aspect of the present invention, an apparatus for removing an organic antireflection coating formed on a semiconductor substrate is provided. This apparatus comprises a reaction chamber storing the semiconductor substrate formed with the organic antireflection coating. A heater for heating the aforementioned semiconductor substrate is provided in the aforementioned reaction chamber. The apparatus further comprises an ozone supplier supplying ozone into the aforementioned reaction chamber.

Preferably, the apparatus for removing an organic antireflection coating further comprises a gas shower head, provided in the aforementioned reaction chamber, having a number of gas nozzles homogeneously spouting ozone fed from the aforementioned ozone supplier toward the aforementioned semiconductor substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 12 to 16 are sectional views of a semiconductor device showing first to fifth steps of a conventional method of forming a resist pattern;

FIGS. 17A and 17B illustrate a problem in the conventional method of forming a resist pattern;

DESCRIPTION OF THE PREFERRED EMBODIMENTS

An embodiment of the present invention is now described with reference to the drawings.

Figure 1:
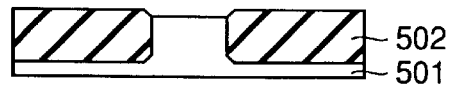
FIGS. 1 to 8 are sectional views of a semiconductor device showing first to eight steps of a method of forming a resist pattern according to an embodiment of the present invention.

Referring to FIG. 1, a silicon substrate 501 formed with an isolation oxide film 502 is prepared.

Figure 2:
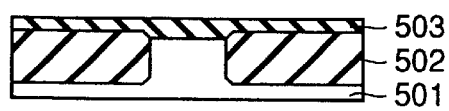

Referring to FIG. 2, an organic antireflection coating 503 is formed on the silicon substrate 501.

Figure 3:
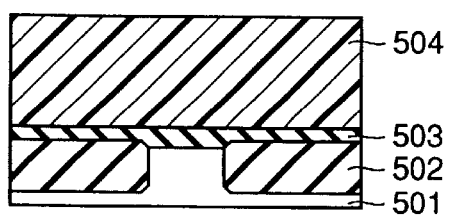

Referring to FIG. 3, a photosensitive resist film 504 is formed on the silicon substrate 501 through the organic antireflection coating 503.

Figure 4:
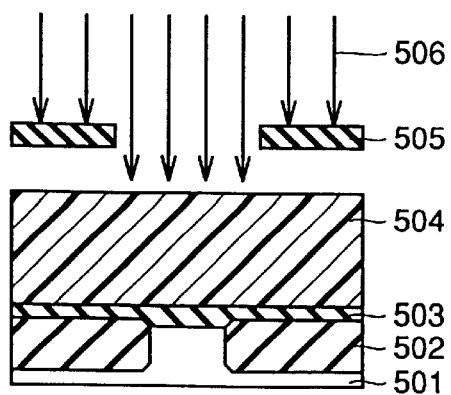

Referring to FIG. 4, the photosensitive resist film 504 is exposed to exposure light 506 through a mask pattern 505.

Figure 5:
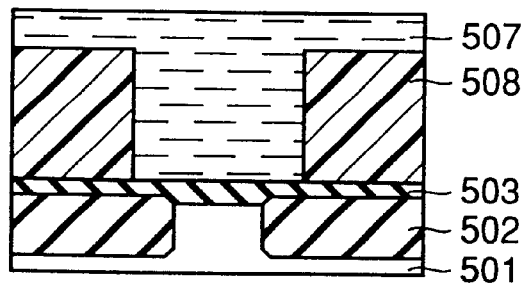
Figure 6:
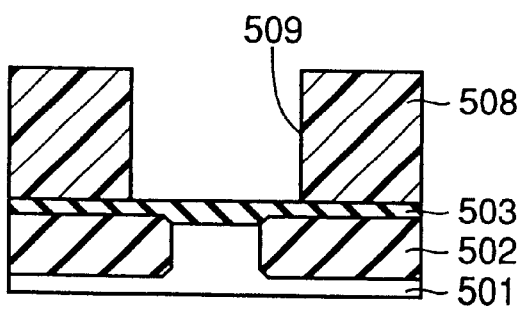

Referring to FIGS. 5 and 6, the resist film 504 is developed in a developer 507 for forming a resist pattern 508. At this time, an opening 509 is formed in the resist pattern 508.

Figure 7:
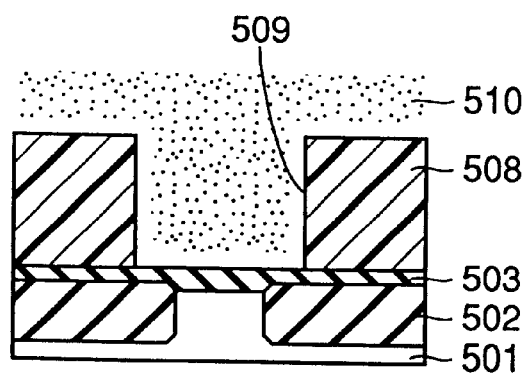

Referring to FIG. 7, the silicon substrate 501 is heated and exposed to ozone or an O radical atmosphere 510. Ozone is thermally decomposed on the heated silicon substrate 501, to generate an O radical, i.e., atomic oxygen.

Figure 8:
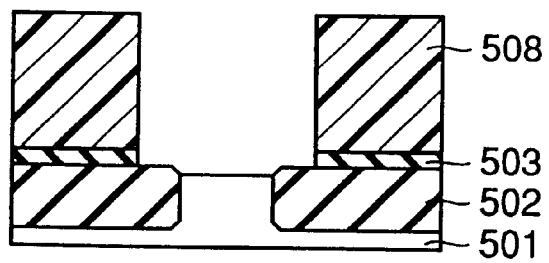

Referring to FIGS. 7 and 8, this atomic oxygen has high reactivity with respect to organic matter, and substances forming the organic antireflection coating 503 are decomposed into $CO_x$, $NO_x$, $SO_x$ and $H_2O$ and evaporated. Therefore, a part of the organic antireflection coating 503 located on the bottom of the opening 509 is removed.

$O_2$ plasma may be employed for removing the part of the organic antireflection coating 503 located on the bottom of the opening 509. When employing plasma, however, the silicon substrate 501 is shocked by charged species and the substances contained in the organic antireflection coating 503 are secondarily injected into the silicon substrate 501 to contaminate the silicon substrate 501. Therefore, the organic antireflection coating 503 must not be directly exposed to the plasma. More specifically, Na atoms contained in the resist film 504 in an extremely small amount are secondarily injected into a portion around the surface of the silicon substrate 501 to increase the oxidizing velocity in a later step of oxidizing the silicon substrate 501, disadvantageously resulting in an abnormal shape of an oxide layer.

When employing ozone in the present invention, the silicon substrate 501 must be properly heated in order to thermally decompose ozone and generate atomic oxygen as described above. Also when employing the air directly containing atomic oxygen, the decomposition rate of organic matter can be increased with excellent controllability by heating the silicon substrate 501. If the heating temperature is excessively increased, however, the temperature of the resist pattern 508 exceeds the glass transition temperature thereof and hence its shape is deteriorated. Therefore, the heating step must be carefully carried out.

When removing the part of the organic antireflection coating 503 located on the bottom of the opening 509 as shown in FIG. 7, the resist pattern 508 of the same organic material is also etched in the present invention. However, no remarkable influence is exerted since the thickness of the organic antireflection coating 503 is generally not more than about 1/10 of the height (thickness) or the pattern size of the resist pattern 508. This problem can be solved by previously forming the mask pattern 505 in a size allowing for retraction as well as loss of the thickness of the resist pattern 508 etched when removing the part of the organic antireflection coating 503.

EXAMPLES

Examples of the present invention are now described with reference to the drawings.

First Example

First Example of the present invention is applied to a process of forming a resist pattern for ion implantation employed for forming wells used for device isolation in steps of manufacturing a CMOS integrated circuit.

Referring again to FIG. 1, a shallow trench isolation structure is formed on a P-type silicon substrate 501 by a normal method. The shallow trench isolation structure is obtained by forming a shallow trench in the silicon substrate 501 by dry etching through a mask of $Si_3N_4$, depositing an isolation oxide film 502 in the trench by CVD (chemical vapor deposition) and thereafter polishing the isolation oxide film 502 by CMP (chemical mechanical polishing) to expose the $Si_3N_4$ film, thereby removing the $Si_3N_4$ film. FIG. 1 is a sectional view of a semiconductor device in a state immediately after removing the $Si_3N_4$ film.

In general, the shape of the isolation oxide film 502 varies with pattern arrangement of the isolation oxide film 502 and change of the process over time due to the properties of dry etching and CMP. When directly applying photosensitive resist onto the silicon substrate 1 for forming a resist pattern, therefore, problems arise as described with reference to FIGS. 12 to 20 in relation to the prior art.

In this Example, a resist pattern 508 is formed through the steps shown in FIGS. 2 to 8 following the step of FIG. 1, as hereinabove described. Then, the resist pattern 508 is employed as a mask for performing ion implantation for forming a P well and an N well.

Referring to FIG. 2, a film of SWKT5 (trade name: by Tokyo Ohka Kogyo Co., Ltd.) is formed as an organic antireflection coating 503 in a thickness of 120 nm by spin application.

Referring to FIG. 3, a film of IX305 (trade name: by Japan Synthetic Rubber Co., Ltd.), which is i-ray positive resist, is formed as a photosensitive resist film 504 in a thickness of 2920 nm by spin application. While the thickness of such a resist film necessary for ion implantation is 2700 nm immediately after the spin application, the thickness of the resist pattern 508 is lost by about 220 nm when removing the organic antireflection coating 503 later. Therefore, the photosensitive resist film 504 is applied with an allowance.

Referring to FIG. 4, the photosensitive resist film 504 is exposed through an i-ray stepper and a positive mask pattern 505. When removing a part of the organic antireflection coating 503 located on an opening 509 of the resist pattern 508, the resist pattern 508 horizontally retracts by about 220 nm. Therefore, the organic mask pattern 505 is preferably provided with an offset quantity corresponding to this retraction of the resist pattern 508.

Referring to FIGS. 5 and 6, development is performed after the exposure for obtaining the resist pattern 508.

According to this Example, the organic antireflection coating 503 is so employed that the photosensitive resist film 504 can be exposed while substantially suppressing influence by the underlayer. Consequently, the obtained resist pattern 508 has high rectangularity as well as high dimensional stability in sectional shape. The difference between maximum and minimum sizes of a sampling pattern (the pattern of the opening 509 of the resist pattern 508) of 1.5 $\mu$m provided with no organic antireflection coating 503 was 0.1 $\mu$m, while that of a sampling pattern provided with the antireflection coating 503 was 0.04 $\mu$m. Consequently, controllability for the sizes of the wells was so improved that it was possible to reduce the distance between elements by about 0.06 $\mu$m as compared with the prior art.

Referring to FIG. 7, the part of the organic antireflection coating 503 located on the bottom of the opening 509 of the resist pattern 508 is removed with ozone 510.

Figure 9:
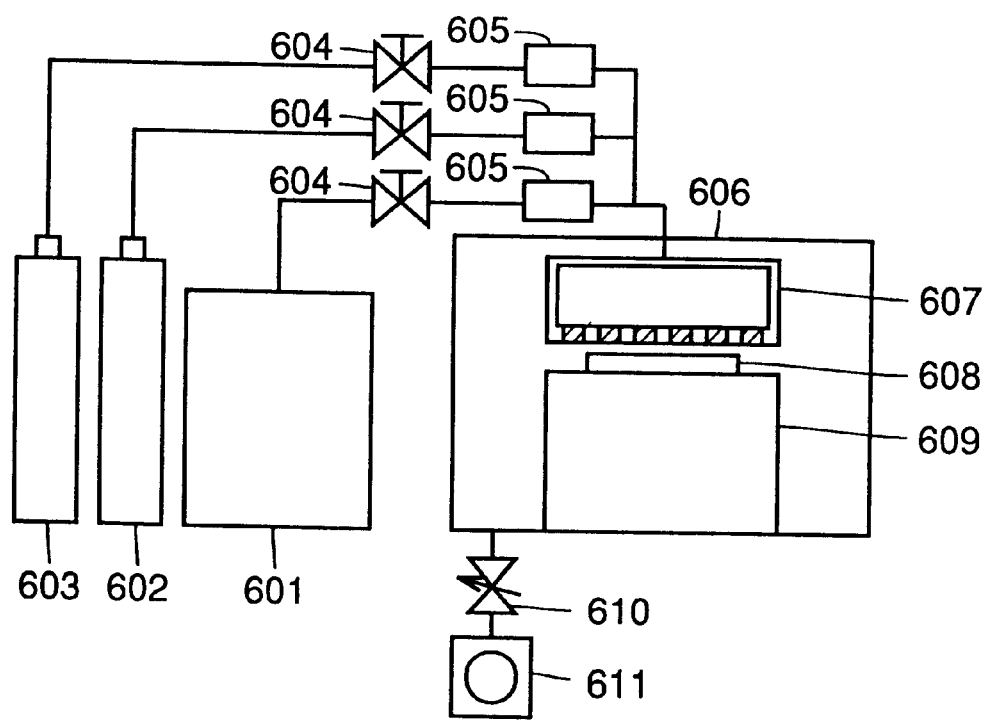
FIG. 9 is a conceptual diagram of an apparatus for removing an organic antireflection coating according to first Example of the present invention.

FIG. 9 is a conceptual diagram of an apparatus employed in this Example.

Referring to FIG. 9, ozone, $N_2$ and $O_2$ serving as process gas are introduced into a gas shower head 607 provided in a reaction chamber 606 from an ozonizer 601, an $N_2$ cylinder 602 and an $O_2$ cylinder 603 through cut valves 604 and mass flow controllers 605 respectively. The gas shower head 607 is provided with a number of gas nozzles for homogeneously supplying the process gas to a wafer 608. The wafer 608 is placed on a temperature-controlled wafer susceptor 609 provided in the reaction chamber 606. A pressure control valve 610 and a pump 611 keep the reaction chamber 606 in a proper pressure state. In this Example, the following wafer processing conditions were employed:

Ozone Flow Rate: 40 SLM (standard litter per minute)

Temperature of Wafer Susceptor: 110° C.

$O_2$ Flow Rate: 20 SLM

Pressure of Reaction Chamber: 110 kPa $N_2$ Flow Rate: 20 SLM

Organic matter removing rates under the aforementioned conditions were as follows:

Organic Antireflection Coating: 70 nm/min.

Resist Film: 110 nm/min.

In order to completely remove the organic antireflection coating 503 by 120 nm, the wafer processing time was set to 2 min. Consequently, the part of the organic antireflection coating 503 located on the bottom of the opening 509 of the resist pattern 508 was completely removed while the resist pattern 508 was finished in a prescribed size and a prescribed thickness. No inconvenience was caused by this processing.

Second Example

Figure 10:
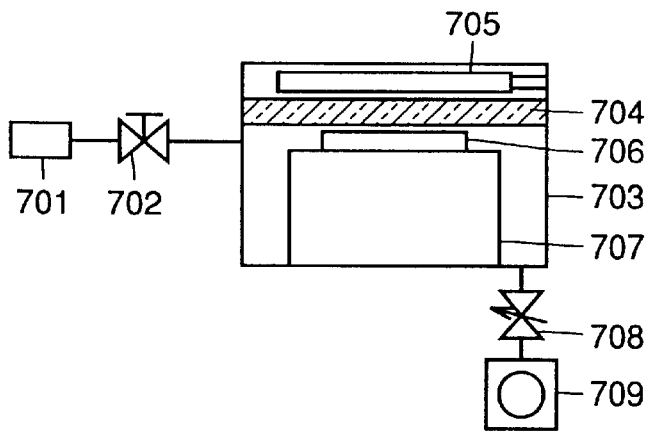
FIG. 10 is a conceptual diagram of an apparatus for removing an organic antireflection coating according to second Example of the present invention.

Second Example of the present invention is applied to steps of manufacturing a semiconductor integrated circuit, similarly to first Example. FIG. 10 shows an apparatus employed in this Example.

Air (79% of $N_2$ and 21% of $O_2$) outgoing from a dry air source 701 is introduced into a reaction chamber 703 through a cut valve 702. An excimer light lamp 705 emitting excimer light of 172 nm is provided on an upper portion of the reaction chamber 703. A quartz window 704 separates the reaction chamber 703 and the excimer light lamp 705 from each other. A wafer 706 is irradiated with the excimer light of 172 nm emitted from the excimer light lamp 705 through the quartz window 704. The wafer 706 is placed on a wafer susceptor 707. The wafer susceptor 707 is temperature-controlled in order to attain process stability. A pressure control valve 708 and a pump 709 keep the reaction chamber 703 at a constant pressure. The excimer light of 172 nm causes the following reaction in the air for generating atomic oxygen having high reactivity with respect to organic matter as a result:

The feature of this Example resides in that the process, including no thermal decomposition process of ozone, can be carried out at a low temperature.

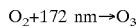

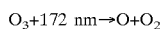

The atomic oxygen attained an effect similar to that of first Example.

In this Example, the wafer 706 was processed under the following conditions:

Dry Air Flow Rate: 30 SLM

Pressure of Reaction Chamber: 90 kPa

Temperature of Wafer Susceptor: 50° C.

Lamp Illuminance: 10 mW/cm²

Quartz Window-to-Wafer Distance: 1 mm

Organic matter removing rates under the aforementioned conditions were as follows:

Organic Antireflection Coating: 10 nm/min.

Resist Film: 11 nm/min.

Third Example

Figure 11:
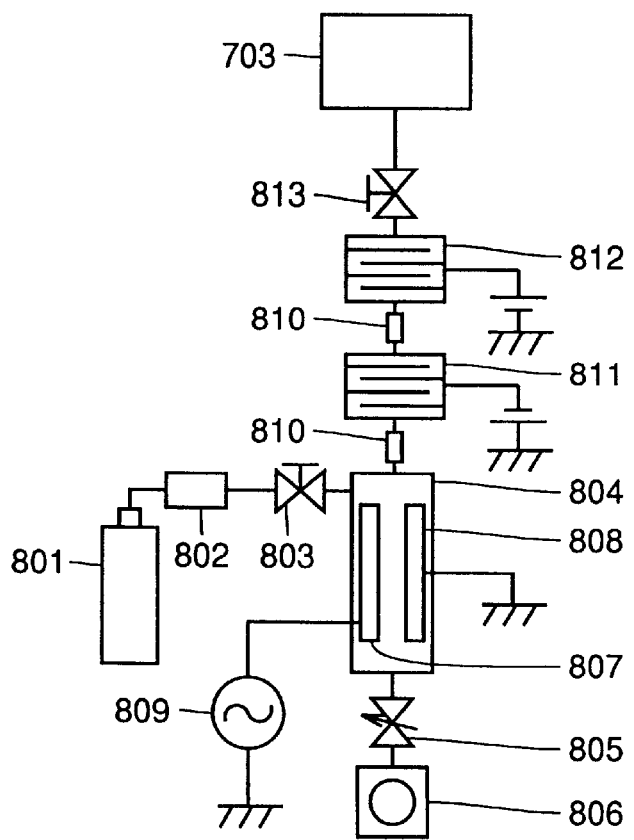
FIG. 11 is a conceptual diagram of an apparatus for removing an organic antireflection coating according to third Example of the present invention.
Figure 12:
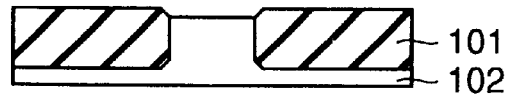
Figure 13:
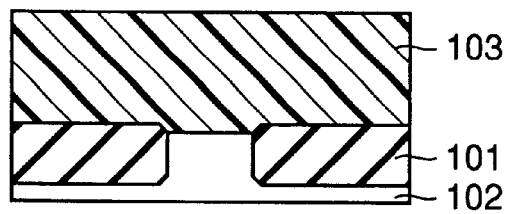
Figure 14:
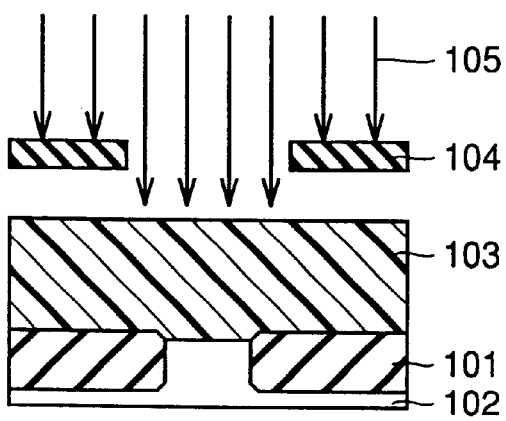
Figure 18A:
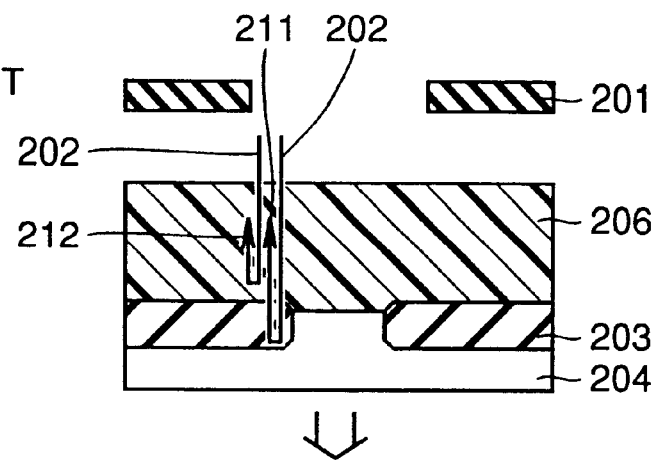
FIGS. 18A and 18B illustrate another problem in the conventional method of forming a resist pattern.
Figure 18B:
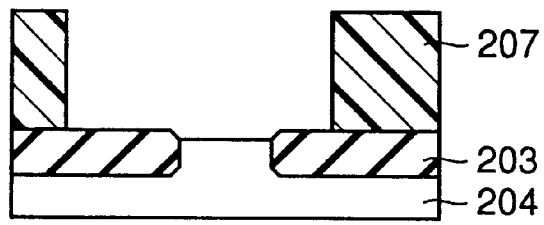
Figure 19A:
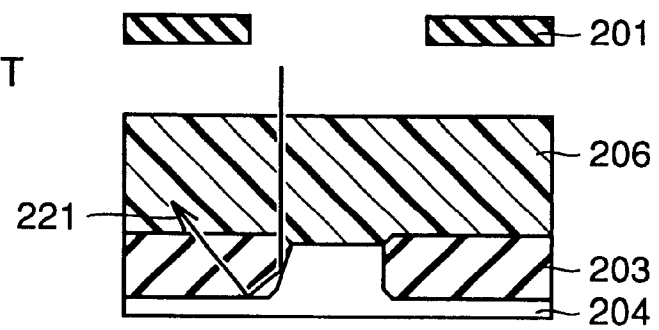
FIGS. 19A and 19B illustrate still another problem in the conventional method of forming a resist pattern.
Figure 19B:
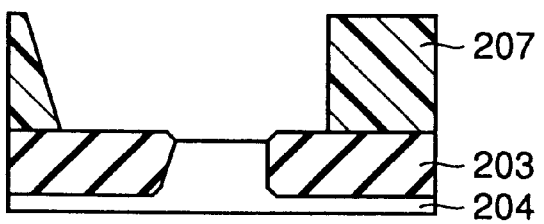
Figure 20:
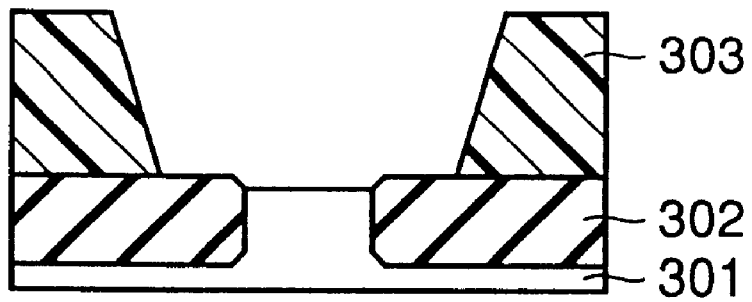
FIG. 20 is a sectional view of a conventional resist pattern formed from a photosensitive resist film containing a dye.
Figure 21:
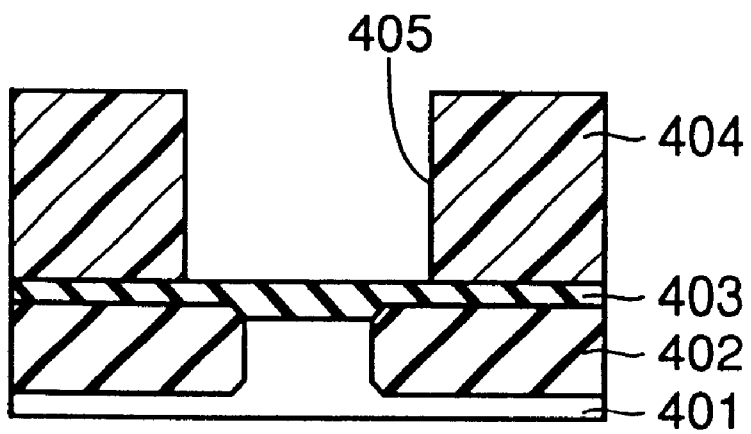
FIG. 21 is a sectional view of a conventional resist film formed through an organic antireflection coating.

Third Example of the present invention is applied to steps of manufacturing a semiconductor integrated circuit, similarly to first Example. FIG. 11 shows an apparatus employed in this Example.

The apparatus shown in FIG. 11 is different from that shown in FIG. 9 in a point that the same employs a device supplying atomic oxygen in place of the ozonizer 601.

In principle, the apparatus generates $O_2$ plasma and removes charged species therefrom.

$O_2$ is introduced into a reaction chamber 804 from an $O_2$ cylinder 801 through a mass flow controller 802 and a cut valve 803. A pressure control valve 805 and a pump 806 keep the reaction chamber 804 at a constant pressure. The reaction chamber 804 is provided therein with an electrode 807 connected with an RF power source 809 and an earth electrode 808 opposite thereto, for generating $O_2$ plasma between the electrodes 807 and 808 by supplying RF power. The $O_2$ plasma is introduced through an insulator pipe 810 to a conductor decompressor 811 to which a negative potential is applied. Charged species carrying positive charges contained in the $O_2$ plasma are so trapped in the conductor decompressor 811 that only charged species carrying negative charges and neutral particles flow to another conductor decompressor 812 downstream the conductor decompressor 811. A positive potential is applied to the conductor decompressor 812, which in turn traps the charged species carrying negative charges contained in the gas passing through the same. Consequently, $O_2$ gas containing electrically neutral atomic oxygen in an excited state is supplied to another reaction chamber 703 through another cut valve 813. The atomic oxygen can be rewarded as an $O_x$ (X=1 to 3) radical. The reaction chamber 703 corresponds to the reaction chamber 606 shown in FIG. 9.

It is to be noted that the portion downstream the reaction chamber 804 is under decompression for generating plasma. It is also to be noted that excessive potential difference between the conductor depressors 811 and 812 results in DC glow discharge. The insulator pipe 810 is employed for electrically isolating the reaction chamber 804 from the conductor decomposer 811, and another insulator pipe 810 is employed for electrically isolating the conductor decomposer 811 from the conductor decomposer 812.

While RF power and plane parallel plate electrodes are employed for generating $O_2$ plasma in this Example, the present invention is not restricted to these but microwave excitation, ECR or a magnetron method may alternatively be employed.

In this Example, the apparatus shown in FIG. 11 was driven under the following conditions:

$O_2$ Flow Rate: 0.5 SLM

Voltage Applied to Conductor Decompressor 811: −1.0 V

RF Power: 500 W

Voltage Applied to Conductor Decompressor 812: +1.0 V

Pressure of Reaction Chamber: 50 Pa

Organic matter removing rates in this Example were as follows:

Organic Antireflection Coating: 20 nm/min.

Resist Film: 25 nm/min.

According to the present invention, as hereinabove described, ozone or atomic oxygen is employed in order not to directly expose the wafer to plasma, thereby effectively preventing contamination. Further, the processing time can be reduced, damage on the resist pattern can be avoided and the processing can be practically performed at a low temperature due to the employment of ozone or atomic oxygen.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for removing an organic antireflection coating formed on a substrate, comprising:

a reaction chamber accommodating a semiconductor substrate having an organic antireflection coating formed thereon;

means for supplying said reaction chamber with air; and means for illuminating said semiconductor substrate with excimer light.

2. An apparatus for removing an organic antireflection coating formed on a semiconductor substrate, comprising:

means for crating a plasma of $O_2$;

means for trapping a positively charged particle in said plasma of $O_2$;

means for trapping a negatively charged particle in said plasma of $O_2$; and a reaction chamber accommodating said semiconductor substrate and receiving oxygen generated by said means for creating a plasma of $O_2$, said means for trapping said positively charged particle and said means for trapping said negatively charged particle, said oxygen being provided in an atom electrically neutral and excited.

3. The apparatus of claim 1, wherein said excimer light includes light having a wavelength of 172 nm.

* * * * *

UNITED STATES PATENT AND TRADEMARK OFFICE
CERTIFICATE OF CORRECTION

PATENT NO.    : 6,481,119 B1
DATED         : November 19, 2002
INVENTOR(S)   : Jiro Ito It is certified that error appears in the above-identified patent and that said Letters Patent is hereby corrected as shown below:

<u>Title page, Item [54] and Column 1, line 1,</u>
Title, before the word "APPARATUS" insert -- METHOD OF FORMING RESIST PATTERN, METHOD OF MANUFACTURING SEMICONDUCTOR DEVICE AND --

Signed and Sealed this

Twenty-fourth Day of June, 2003

JAMES E. ROGAN
*Director of the United States Patent and Trademark Office*